(12) United States Patent
Yang et al.

(10) Patent No.: US 9,570,704 B2
(45) Date of Patent: Feb. 14, 2017

(54) DISPLAY DEVICE

(71) Applicant: InnoLux Corporation, Miao-Li County (TW)

(72) Inventors: Yi-Xin Yang, Miao-Li County (TW); Cheng-Hsu Chou, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/735,968

(22) Filed: Jun. 10, 2015

(65) Prior Publication Data

US 2015/0364722 A1 Dec. 17, 2015

(30) Foreign Application Priority Data

Jun. 11, 2014 (TW) .............................. 103120196 A

(51) Int. Cl.
*H01L 51/50* (2006.01)
*H01L 51/52* (2006.01)
*H01L 27/32* (2006.01)

(52) U.S. Cl.
CPC .......... *H01L 51/5246* (2013.01); *H01L 27/32* (2013.01)

(58) Field of Classification Search
CPC .. H01L 51/50; H01L 51/5259; H01L 51/5235; H01L 51/5246; H01L 51/0024
See application file for complete search history.

(56) References Cited

U.S. PATENT DOCUMENTS

| 8,957,424 B2* | 2/2015 | Ono ................................. 257/72 |
| 2007/0172971 A1 | 7/2007 | Boroson |
| 2008/0036960 A1* | 2/2008 | Ding ................. G02F 1/133377 349/156 |
| 2011/0133213 A1* | 6/2011 | Lee .......................... H01J 7/183 257/79 |
| 2015/0171155 A1* | 6/2015 | Yun ..................... H01L 51/5243 257/40 |

FOREIGN PATENT DOCUMENTS

| CN | 1908777 A | 2/2007 |
| CN | 101233553 A | 7/2008 |
| JP | 2011242765 A | 12/2011 |
| JP | 2013218796 A | 10/2013 |

* cited by examiner

*Primary Examiner* — Phuc Dang
(74) *Attorney, Agent, or Firm* — Muncy, Geissler, Olds & Lowe, P.C.

(57) ABSTRACT

A display device includes a first substrate, a second substrate, a connecting element and a display medium. The first and second substrates are disposed opposite to each other, and the connecting element is disposed between the first and second substrates. An accommodating space is formed between the first substrate, the second substrate and the connecting element, and the display medium is disposed in the accommodating space. The connecting element has a first sealing layer, a second sealing layer and an adhesive layer. The first and second sealing layers are departed or partially connected. The second sealing layer is disposed adjacent to the accommodating space. The adhesive layer is disposed between the first and second sealing layers. The adhesive layer includes a water-resisting material.

12 Claims, 6 Drawing Sheets

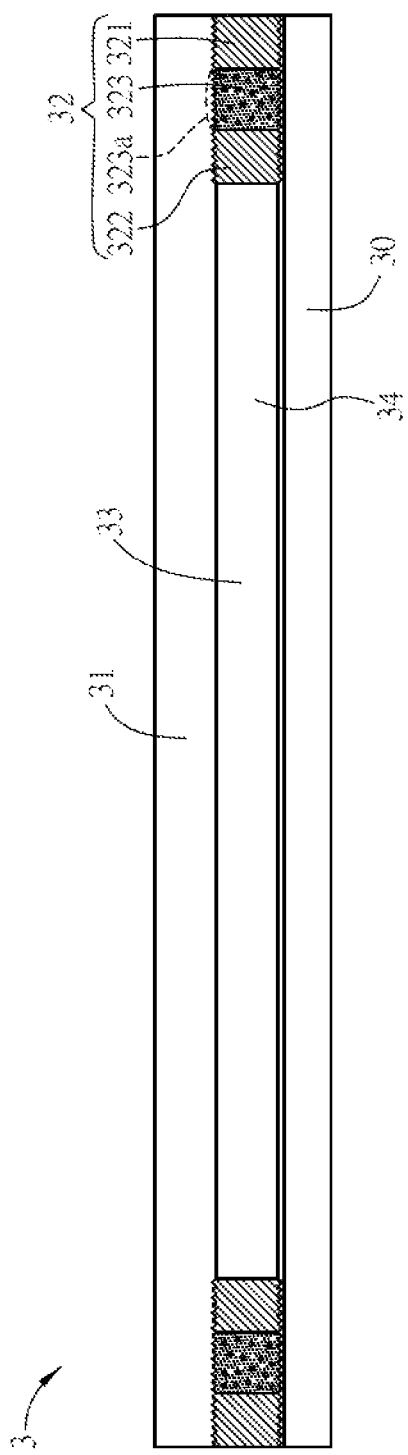
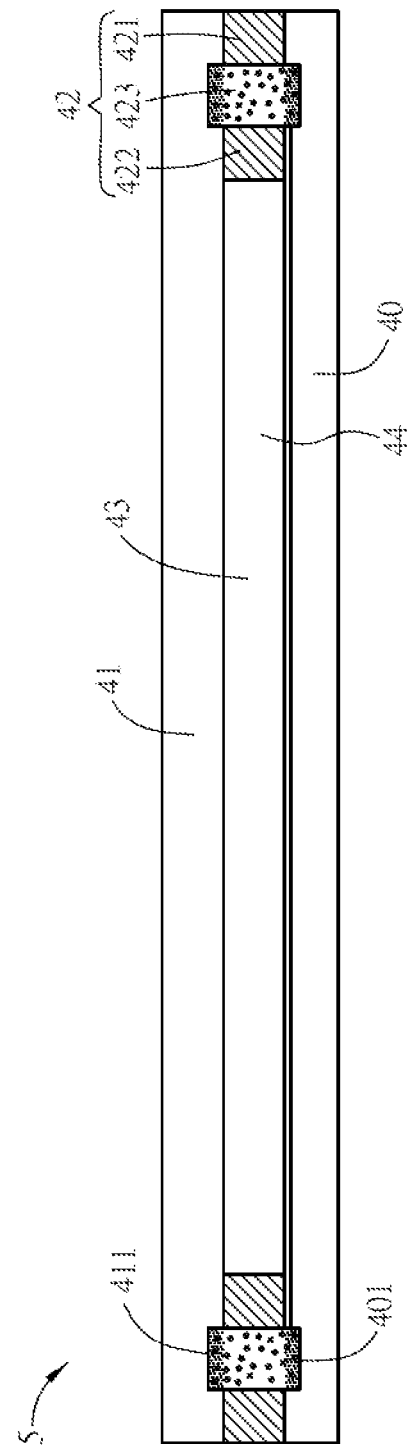
FIG. 3
FIG. 4

DISPLAY DEVICE

CROSS REFERENCE TO RELATED APPLICATIONS

This Non-provisional application claims priority under 35 U.S.C. §119(a) on Patent Application No(s). 103120196 filed in Taiwan, Republic of China on Jun. 11, 2014, the entire contents of which are hereby incorporated by reference.

BACKGROUND

Technical Field

The invention relates to a display device.

Related Art

OLED (organic light emitting diode) display devices have the advantages of thinner size, lighter weight, higher illumination efficiency, lower driving voltage and simple manufacturing process, so they have become one of the best choices for the new generation flat display devices.

After the manufacturing of the OLED display device, the environment moisture and oxygen may enter into the display device and react to the internal electrodes. In some serious cases, the entered moisture and oxygen can cause the separation of the electrode layer, the decrease of the lighting intensity, the black spots and the likes. In addition, the display device may also contain the moisture and oxygen generated in the package process and operation procedure, and these generated moisture and oxygen can also react with the internal electrodes.

To solve this problem, the conventional art tries to coat a sealing layer structure between the first and second substrates during the package process for blocking the external moisture and oxygen. However, this solution is not good enough. In fact, there are a small amount of moisture and oxygen that can enter the display device through the leak between the sealing layer and the substrate.

Therefore, it is an important subject to provide a novel design of a display device that can block the external moisture and oxygen and thus extend the lifetime of the display device.

SUMMARY

An objective of the invention is to provide a display device that can block the external moisture and oxygen and thus extend the lifetime of the display device.

To achieve the above objective, the present invention discloses a display device includes a first substrate, a second substrate, a connecting element and a display medium. The first and second substrates are disposed opposite to each other, and the connecting element is disposed between the first and second substrates. An accommodating space is formed between the first substrate, the second substrate and the connecting element, and the display medium is disposed in the accommodating space.

The connecting element has a first sealing layer, a second sealing layer and an adhesive layer. The first and second sealing layers are departed or partially connected. The second sealing layer is disposed adjacent to the accommodating space. The adhesive layer is disposed between the first and second sealing layers. The adhesive layer includes a water-resisting material.

In one embodiment, the adhesive layer further contains a water-absorbing material.

In one embodiment, the water-absorbing material includes barium oxide, calcium oxide, calcium sulfate, calcium silicate, magnesium oxide, barium metal salts, magnesium metal salts, calcium metal salts, or mixtures thereof.

In one embodiment, the volume percentage of the water-absorbing material in the adhesive layer ranges from 5 to 50 percent.

In one embodiment, the volume percentage of the water-absorbing material ranges from 5 to 15 percent.

In one embodiment, the connecting element further includes a water-absorbing layer disposed between the second sealing layer and the display medium.

In one embodiment, the first sealing layer and the second sealing layer are made of epoxy, silicone, rubber, acrylic resin or a combination thereof.

In one embodiment, a contact position between the adhesive layer and at least one of the first substrate and the second substrate is formed with a recess, and the adhesive layer is embedded in the recess.

In one embodiment, the water-resisting material of the adhesive layer comprises epoxy resin, rubber, acrylic, organic silicon pressure-sensitive adhesive, ultraviolet-curable resin, thermosetting resin or a mixture thereof.

In one embodiment, the display medium includes an organic light-emitting material.

As mentioned above, the invention configures the first sealing layer, the second sealing layer and the adhesive layer containing a water-resisting material so as to enhance the bonding between the first and second substrates, thereby preventing the erosion of the internal components of the display device by environmental moisture and oxygen. Accordingly, this configuration can properly prevent the deterioration and damage of the display device and extend the lifetime of the display device.

BRIEF DESCRIPTION OF THE DRAWINGS

The embodiments will become more fully understood from the detailed description and accompanying drawings, which are given for illustration only, and thus are not limitative of the present invention, and wherein:

FIG. 3 is a sectional view of a display device according to a third embodiment of the invention;

FIG. 4 is a sectional view of a display device according to a fourth embodiment of the invention;

DETAILED DESCRIPTION OF THE INVENTION

The embodiments of the invention will be apparent from the following detailed description, which proceeds with reference to the accompanying drawings, wherein the same references relate to the same elements.

Figure 1A:
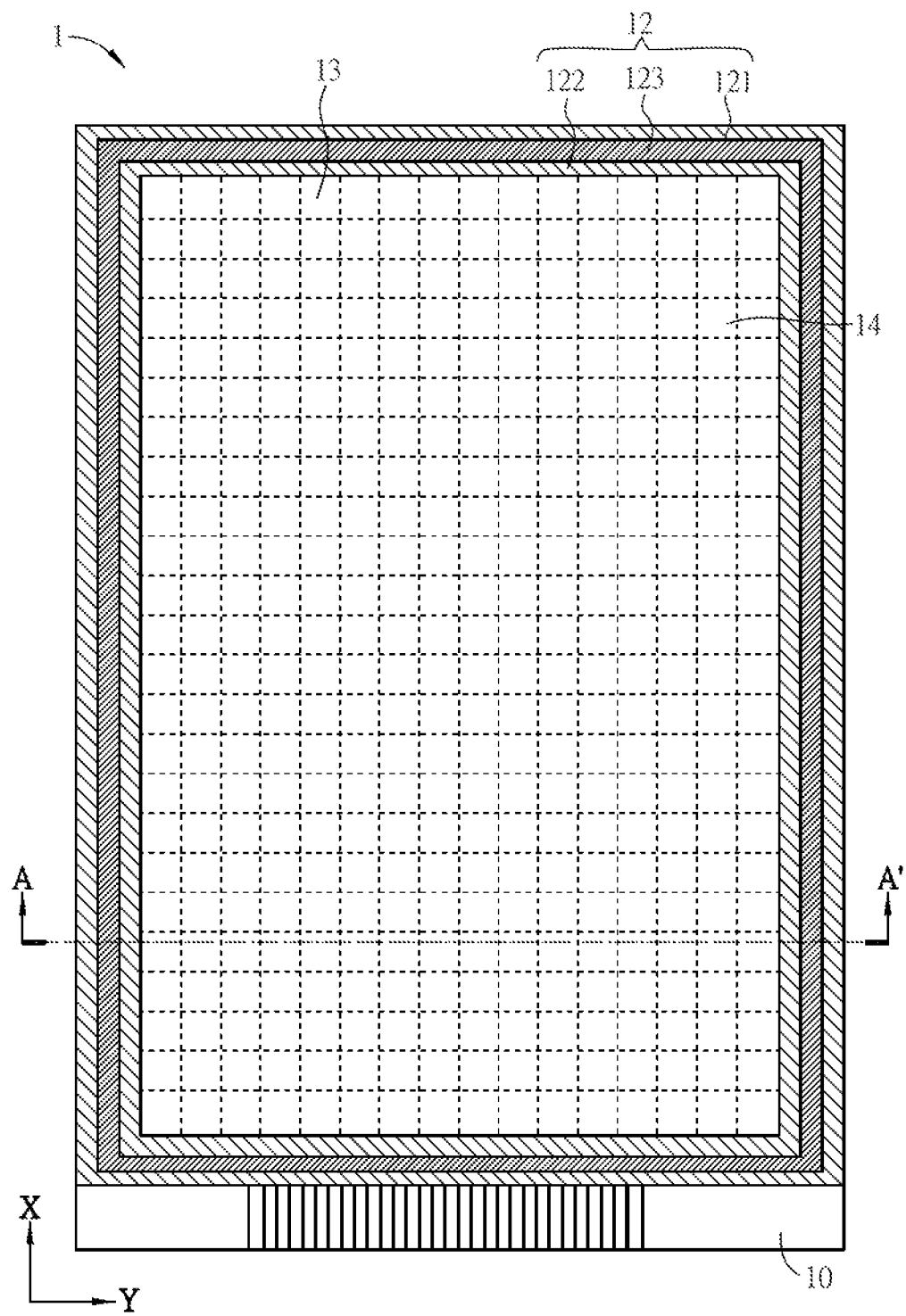
FIG. 1A is a top view of a display device according to a first embodiment of the invention.
Figure 1B:
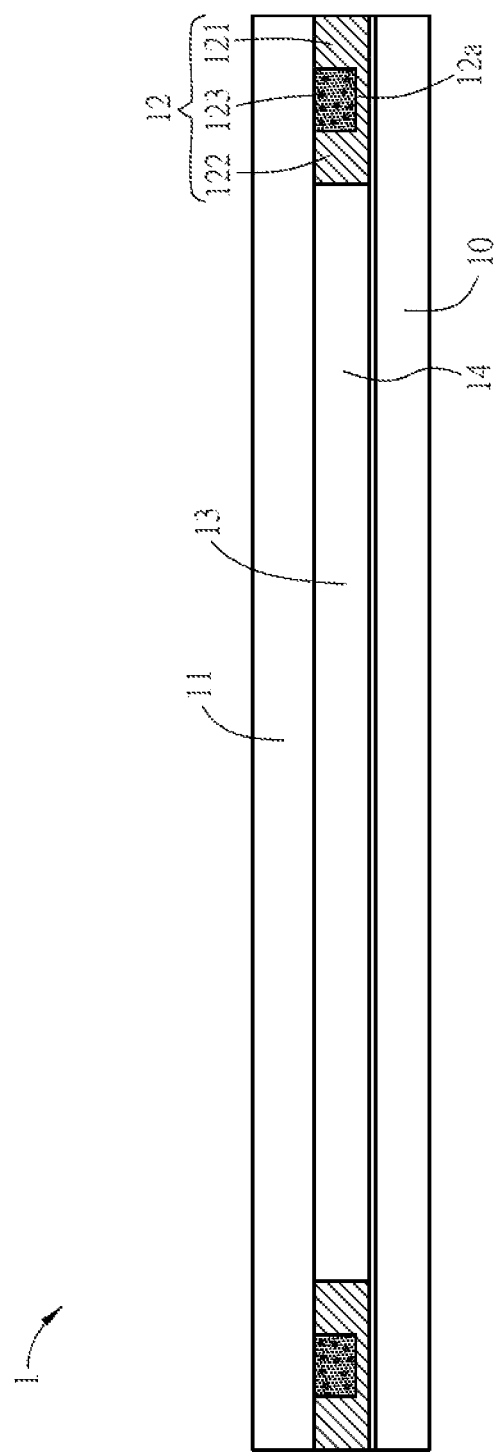
FIG. 1B is a sectional view of the display device of FIG. 1A taken along the line A-A'.

FIG. 1A is a top view of a display device 1 according to a first embodiment of the invention, and FIG. 1B is a sectional view of the display device 1 of FIG. 1A taken along the line A-A'.

Referring to FIGS. 1A and 1B, a display device 1 includes a first substrate 10, a second substrate 11, a connecting element 12 and a display medium 13. The first substrate 11 and the second substrate 12 are disposed opposite to each other. In this embodiment, each of the first substrate 10 and the second substrate 11 can be made of glass, transparent plastics, polymers, metal adhesive films, or ceramic materials.

The connecting element 12 is disposed between the first substrate 10 and the second substrate 11. The first substrate 10, the second substrate 11 and the connecting element 12 form an accommodating space 14, and the display medium 13 is located in the accommodating space 14. Wherein, the connecting element 12 is disposed around the display medium 13. In this embodiment, the display medium 13 can be made of organic light emitting materials.

Referring to FIG. 1B, the connecting element 12 at least includes a first sealing layer 121, a second sealing layer 122 and an adhesive layer 123. The second sealing layer 122 is disposed adjacent to the accommodating space 14. In more details, the first sealing layer 121, the second sealing layer 122 and the adhesive layer 123 are disposed around the display medium 13. The first sealing layer 121 and the second sealing layer 122 can be made of epoxy, silicone, rubber, acrylic resin or a combination thereof.

In this embodiment, the first sealing layer 121 and the second sealing layer 122 are partially connected so as to form a groove 12a in the connecting element 12. In addition, the adhesive layer 123 is disposed between the first sealing layer 121 and the second sealing layer 122. That is, the adhesive layer 123 can be disposed in the groove 12a. In this case, the adhesive layer 123 is made of a mixture containing a water-resisting material and a water-absorbing material. The width of the adhesive layer 123 is about 0.5-7 mm, and the thickness thereof is about 0.5-50 μm. To be noted, the width and thickness thereof in this invention are not limited.

The water-resisting material of the adhesive layer 123 includes epoxy resin, rubber, acrylic, organic silicon pressure-sensitive adhesive, ultraviolet-curable resin, thermosetting resin or a mixture thereof. The water-absorbing material of the adhesive layer 123 can be various depending on the water absorption method. For example, the material of the water-absorbing material can be barium oxide, calcium oxide, calcium sulfate, calcium silicate, magnesium oxide, barium metal salts, magnesium metal salts, calcium metal salts, or mixtures thereof. These materials can include a chemical substance that is capable of reacting with water, so that the external moisture can be absorbed by these materials while penetrating through the adhesive layer 123. Alternatively, the adhesive layer 123 may include a porous material (like a molecular sieve), so that the environmental moisture can be blocked as the above approach by a physical way.

When the adhesive layer 123 includes a single water-resisting layer, the adhesive layer 123 can provide a good water-resisting effect and a good adhesion with the first substrate 10 and the second substrate 11. However, this kind of adhesive layer 123 cannot absorb the moisture in the display medium 13. Accordingly, when the volume percentage of the water-absorbing material in the adhesive layer 123 ranges from 5 to 50 percent (which means the volume percentage of the water-resisting material in the adhesive layer 123 ranges from 95 to 50 percent), the adhesive layer 123 can provide a higher adhesion and a proper water absorption to the display medium 13. In this embodiment, when the water-resisting material in the adhesive layer 123 is 90 percent, the adhesive layer 123 can provide an adhesion of about 0.7 Nt/m². Preferably, the volume percentage of the water-absorbing material in the adhesive layer 123 is controlled to between 5 and 15 percent.

To be noted, the ratios of the water-absorbing material and the water-resisting material can be adjusted according to the requirement. If it is desired to increase the adhesion between the first substrate 10 and the second substrate 11, the ratio of the water-resisting material is increased. If it is desired to increase the water absorption ability of the adhesive layer 123, the ratio of the water-absorbing material is increased. For example, when the volume percentage of the water-absorbing material is adjusted to 50 percent, the adhesive layer 123 can provide a water-absorbing ability of 550 g/m² per day.

In brief, the configuration of the first sealing layer 121, the second sealing layer 122 and the adhesive layer 123 can block the moisture and oxygen from entering the display device and absorb the moisture existing in the display medium 13 during the assembling process. Accordingly, this configuration can properly prevent the deterioration and damage of the display device and extend the lifetime of the display device.

Figure 2:
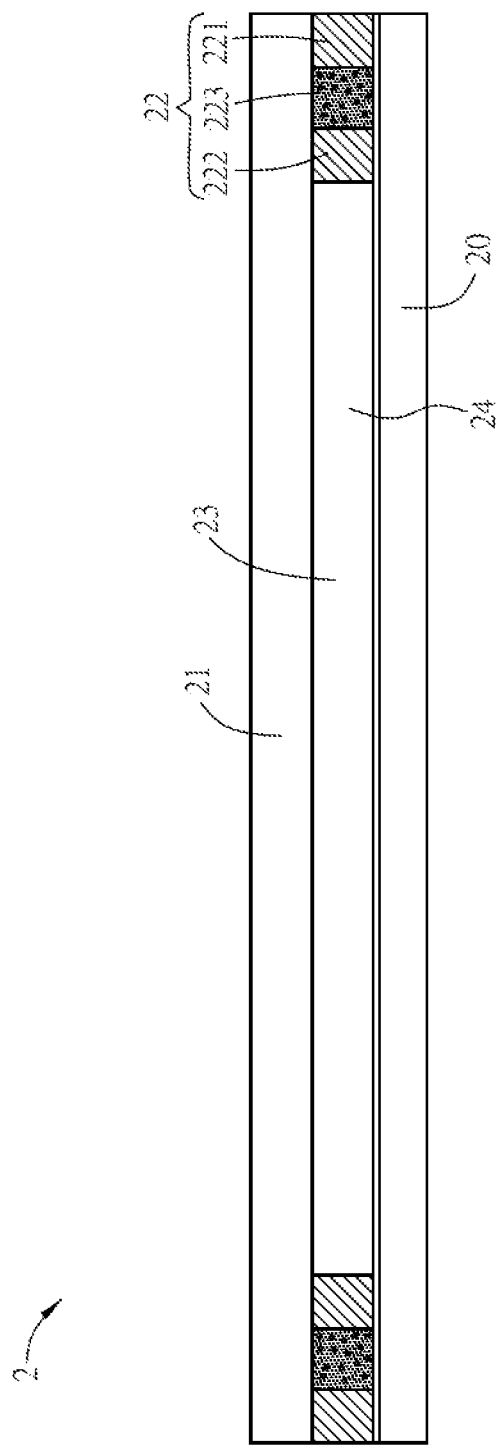
FIG. 2 is a sectional view of a display device according to a second embodiment of the invention.

FIG. 2 is a sectional view of a display device 2 according to a second embodiment of the invention.

Similarly, the display device 2 includes a first substrate 20, a second substrate 21, a connecting element 22 and a display medium 23. The first substrate 20, the second substrate 21 and the connecting element 22 form an accommodating space 24, and the display medium 23 is located in the accommodating space 24. The connecting element 22 at least includes a first sealing layer 221, a second sealing layer 222 and an adhesive layer 223.

Different from the first embodiment, the first sealing layer 221 and the second sealing layer 222 of the second embodiment are departed from each other, and the adhesive layer 223 is filled between the first sealing layer 221 and the second sealing layer 222. In this embodiment, the adhesive layer 223 contacts to both of the first substrate 20 and the second substrate 21, so that the adhesive layer 223 can provide better adhesion, water-resisting and water-absorbing functions than the first embodiment.

The configurations and effects of other components are similar to the above embodiment, so the detailed description thereof will be omitted.

FIG. 3 is a sectional view of a display device 3 according to a third embodiment of the invention.

Similarly, the display device 3 includes a first substrate 30, a second substrate 31, a connecting element 32 and a display medium 33. The first substrate 30, the second substrate 31 and the connecting element 32 form an accommodating space 34, and the display medium 33 is located in the accommodating space 34. The connecting element 32 at least includes a first sealing layer 321, a second sealing layer 322 and an adhesive layer 323.

Different from the second embodiment, a contact position between the adhesive layer 323 and at least one of the first substrate 30 and the second substrate 31 is formed with a plurality of microstructures 323a. The microstructure 323a can have a sawtooth shape, a dot shape, a cone shape, or a rectangle shape, and this invention is not limited.

In addition, a contact position between the first substrate 30 and the first sealing layer 321, between the first substrate 30 and the second sealing layer 322, between the second substrate 31 and the first sealing layer 321 or between the second substrate 31 and the second sealing layer 322 may also be configured with a plurality of microstructures 323a.

The configuration of the microstructures can increase the contact surface between one of the first substrate 30 and the second substrate 31 and one of the first sealing layer 321, the second sealing layer 322 and the adhesive layer 323 so as to increasing the adhesion force, and extend the traveling distance of the moisture and oxygen entering the accommodating space. In general, the external moisture and oxygen usually enter the accommodating space through the junctions between one of the first substrate 30 and the second substrate 31 and one of the first sealing layer 321, the second sealing layer 322 and the adhesive layer 323. Thus, the additional microstructures can extend the traveling distance the moisture and oxygen entering the accommodating space so as to improve the water-resisting and water-absorbing effects of the adhesive layer.

The configurations and effects of other components are similar to the above embodiments, so the detailed description thereof will be omitted.

FIG. 4 is a sectional view of a display device 4 according to a fourth embodiment of the invention.

Similarly, the display device 4 includes a first substrate 40, a second substrate 41, a connecting element 42 and a display medium 43. The first substrate 40, the second substrate 41 and the connecting element 42 form an accommodating space 44, and the display medium 43 is located in the accommodating space 44. The connecting element 42 at least includes a first sealing layer 421, a second sealing layer 422 and an adhesive layer 423.

Different from the third embodiment, a contact position between the adhesive layer 423 and at least one of the first substrate 40 and the second substrate 41 is formed with a recess (e.g. the recesses 401 and 411). Accordingly, the adhesive layer 423 can be embedded into the recesses 401 and 411. The shape of the recesses 401 and 411 is not limited to that shown in the figure.

The recesses 401 and 411 have similar effect as the microstructures in the previous embodiment. In more details, the recesses 401 and 411 can increase the adhesion force between the first substrate 40 and the second substrate 41, and extend the traveling distance of the moisture and oxygen entering the accommodating space so as to improve the water-resisting and water-absorbing effects of the adhesive layer.

The configurations and effects of other components are similar to the above embodiments, so the detailed description thereof will be omitted.

Figure 5A:
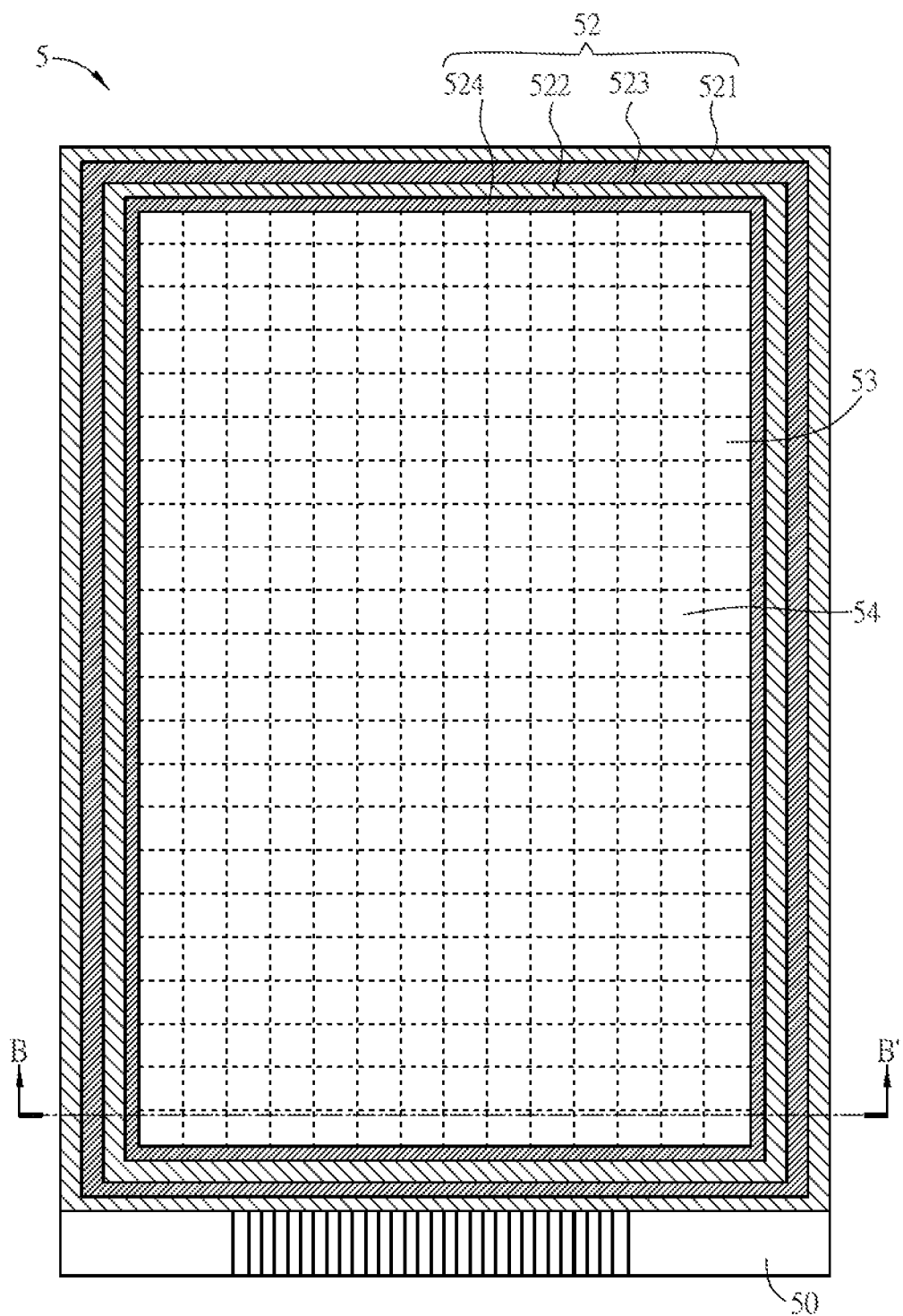
FIG. 5A is a top view of a display device according to a fifth embodiment of the invention.
Figure 5B:
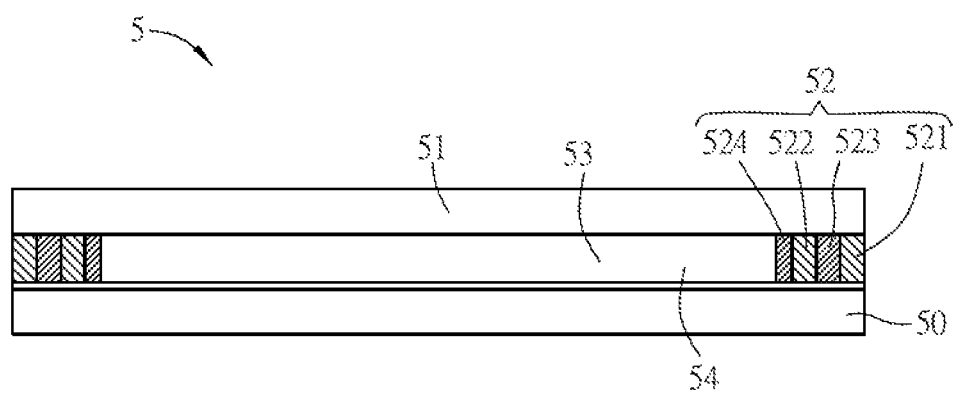
FIG. 5B is a sectional view of the display device of FIG. 5A taken along the line B-B'.

FIG. 5A is a top view of a display device 5 according to a fifth embodiment of the invention, and FIG. 5B is a sectional view of the display device 5 of FIG. 5A taken along the line B-B'.

Similarly, the display device 5 includes a first substrate 50, a second substrate 51, a connecting element 52 and a display medium 53. The first substrate 50, the second substrate 51 and the connecting element 52 form an accommodating space 54, and the display medium 53 is located in the accommodating space 54. The connecting element 52 at least includes a first sealing layer 521, a second sealing layer 522 and an adhesive layer 523. The second sealing layer 522 is disposed adjacent to the accommodating space 54.

Different from the previous embodiment, the connecting element 52 of the display device 5 further includes a water-absorbing layer 524 disposed between the second sealing layer 522 and the display medium 53. The material of the water-absorbing layer 524 is similar to the water-absorbing material of the adhesive layer in the previous embodiment. Accordingly, the water-absorbing layer 524 can absorb the moisture entering the display device 5 and the moisture inside the accommodating space 54. In this case, the proportion of the water-resisting material in the adhesive layer 523 can be increased, or the adhesive layer 523 can be completely made by the water-resisting material. This configuration can also provide the same water-resisting and water-absorbing effects of the above embodiments.

The configurations and effects of other components are similar to the above embodiments, so the detailed description thereof will be omitted.

In summary, the invention configures the first sealing layer, the second sealing layer and the adhesive layer containing a water-resisting material so as to enhance the bonding between the first and second substrates, thereby preventing the erosion of the internal components of the display device by environmental moisture and oxygen. Accordingly, this configuration can properly prevent the deterioration and damage of the display device and extend the lifetime of the display device.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display device, comprising:
a first substrate;
a second substrate disposed opposite to the first substrate;
a connecting element disposed between the first substrate and the second substrate, wherein the first substrate, the second substrate and the connecting element form an accommodating space, the connecting element has a first sealing layer, a second sealing layer and an adhesive layer, the first sealing layer and the second sealing layer are departed from each other or partially connected, the second sealing layer is disposed adjacent to the accommodating space, the adhesive layer is disposed between the first sealing layer and the second sealing layer, and the adhesive layer contains a water-resisting material; and
a display medium disposed in the accommodating space, wherein the connecting element further comprises a water-absorbing layer disposed between the second sealing layer and the display medium.

2. The display device of claim 1, wherein the adhesive layer further contains a water-absorbing material.

3. The display device of claim 2, wherein the water-absorbing material comprises barium oxide, calcium oxide, calcium sulfate, calcium silicate, magnesium oxide, barium metal salts, magnesium metal salts, calcium metal salts, or mixtures thereof.

4. The display device of claim 2, wherein a volume percentage of the water-absorbing material in the adhesive layer ranges from 5 to 50 percent.

5. The display device of claim 4, wherein the volume percentage of the water-absorbing material ranges from 5 to 15 percent.

6. The display device of claim 1, wherein the water-absorbing layer is made of barium oxide, calcium oxide, calcium sulfate, calcium silicate, magnesium oxide, barium metal salts, magnesium metal salts, calcium metal salts, or mixtures thereof.

7. The display device of claim 1, wherein the first sealing layer is made of epoxy, silicone, rubber, acrylic resin or a combination thereof.

8. The display device of claim 1, wherein the second sealing layer is made of epoxy, silicone, rubber, acrylic resin or a combination thereof.

9. The display device of claim 1, wherein a contact position between the adhesive layer and at least one of the first substrate and the second substrate is formed with a recess, and the adhesive layer is embedded in the recess.

10. The display device of claim 1, wherein a contact position between the adhesive layer and at least one of the first substrate and the second substrate is formed with a plurality of microstructures.

11. The display device of claim 1, wherein the water-resisting material of the adhesive layer comprises epoxy resin, rubber, acrylic, organic silicon pressure-sensitive adhesive, ultraviolet-curable resin, thermosetting resin or a mixture thereof.

12. The display device of claim 1, wherein the display medium comprises an organic light-emitting material.

* * * * *